(12) United States Patent
Lim et al.

(10) Patent No.: US 7,417,870 B2
(45) Date of Patent: Aug. 26, 2008

(54) MULTI-LAYER BOARD WITH DECOUPLING FUNCTION

(75) Inventors: Sung Taek Lim, Gyunggi-do (KR); Yul Kyo Chung, Gyunggi-Do (KR)

(73) Assignee: Samsung Electro-Mechanics Co., Ltd., Gyunggi-Do (KR)

( * ) Notice: Subject to any disclaimer, the term of this patent is extended or adjusted under 35 U.S.C. 154(b) by 0 days.

(21) Appl. No.: 11/709,156

(22) Filed: Feb. 22, 2007

(65) Prior Publication Data
US 2007/0194876 A1 Aug. 23, 2007

(30) Foreign Application Priority Data
Feb. 22, 2006 (KR) .................. 10-2006-0017418

(51) Int. Cl.
*H05K 1/18* (2006.01)
(52) U.S. Cl. .................. 361/763; 361/763; 361/764
(58) Field of Classification Search .................. 361/303, 361/763, 764, 761
See application file for complete search history.

(56) References Cited

U.S. PATENT DOCUMENTS

| | | | |
|---|---|---|---|
| 6,611,419 B1 * | 8/2003 | Chakravorty | 361/306.3 |
| 6,619,419 B1 | 9/2003 | Cheron et al. | |
| 6,724,638 B1 * | 4/2004 | Inagaki et al. | 361/763 |
| 6,920,051 B2 | 7/2005 | Figueroa et al. | |
| 6,940,710 B1 * | 9/2005 | Lee et al. | 361/321.2 |
| 7,035,079 B1 * | 4/2006 | Park et al. | 361/303 |
| 2002/0076919 A1 * | 6/2002 | Peters et al. | 438/637 |
| 2005/0024824 A1 * | 2/2005 | Riebel | |
| 2005/0277389 A1 * | 12/2005 | Friedrich et al. | |
| 2006/0012967 A1 * | 1/2006 | Asai et al. | 361/764 |

FOREIGN PATENT DOCUMENTS

JP  2005-277389  10/2005

OTHER PUBLICATIONS

Korean Office Action issued in corresponding Korean Patent Application No. KR 10-2006-0017418, dated Feb. 13, 2007.

* cited by examiner

*Primary Examiner*—Tuan Dinh
*Assistant Examiner*—Andargie M Aychillhum
(74) *Attorney, Agent, or Firm*—McDermott Will & Emery LLP

(57) ABSTRACT

A multi-layer board having a superior decoupling function in a low frequency band and a radio frequency band. The multi-layer board includes a board body having a plurality of stacked dielectric layers, power terminals connected through a via, ground terminals connected through a via and an integrated circuit component connected to the power and ground terminals. The multi-layer board also includes a power line unit connected to the power terminals and the integrated circuit component and a ground line unit connected to the ground terminals and the integrated circuit component. The multi-layer board further includes at least one multilayer chip capacitor mounted on the board body and connected between the power terminal and the ground terminal formed on the board body and at least one thin film capacitor mounted inside the board body and connected between the power line unit and the ground line unit.

4 Claims, 6 Drawing Sheets

MULTI-LAYER BOARD WITH DECOUPLING FUNCTION

CLAIM OF PRIORITY

This application claims the benefit of Korean Patent Application No. 2006-0017418 filed on Feb. 22, 2006, in the Korean Intellectual Property Office, the disclosure of which is incorporated herein by reference.

BACKGROUND OF THE INVENTION

1. Field of the Invention

The present invention relates to a multi-layer board having a decoupling function, applied to a Ball Grid Array (BGA) type package and, more particularly, to a multi-layer board having a decoupling function using a Multilayer Chip Capacitor (MLCC) and a thin film capacitor to achieve excellent decoupling characteristics in a low frequency band as well as in a radio frequency band.

2. Description of the Related Art

Recently, with higher operating frequency and lower operating voltage in a digital Integrated Circuit (IC) chip, there have been increasing needs for a low impedance decoupling capacitor for more stable supply of power and removal of switching noise.

Such a decoupling capacitor can further lower impedance in a closer proximity to the IC chip, and thus there have been many researches on techniques of forming the capacitor on the IC.

Such a decoupling capacitor is explained briefly.

First, in case of using an off-chip capacitor, it is attached to a printed circuit board or an IC package to be used, which however degrades radio frequency characteristics due to parasitic inductance generated by the wiring length connecting the IC chip to the capacitor.

On the other hand, if formed during a process of constructing transistors on a silicon wafer, the decoupling capacitor is formed in most close proximity to the IC chip, which is most ideal. However, it is not efficient to dispose the decoupling capacitor adjacent to the transistors due to the following two reasons. First, the material used as the electrode inside the chip has a high resistance value, hindering fabrication of a capacitor with a Q value of at least 10. Secondly, forming a passive device inside the chip requires a complex manufacturing process and higher manufacturing costs due to increased cost per unit area since the capacitor is placed in a separate location.

For these reasons, the capacitor to be applied to the chip is usually manufactured by forming a dielectric film between the power and the ground by Back-End-Of-the-Line (BEOL).

The capacitor with application of BEOL is required to have a large capacitance value of at least $100$ $nF/cm^2$, and requires low temperature deposition at a temperature of up to $450°$ C. to prevent oxidation of Cu constituting the wires and maintain the stability of the organic material for substrate constituting the insulation layers.

In general, a system is required to adapt from analog to digital and from low speed, current and voltage to high speed, current and voltage. Therefore, a passive device or device system that can provide low impedance power in a radio frequency region is in demand.

FIG. 1 illustrates a multi-layer board having an MLCC according to the prior art. As shown, the conventional multi-layer board includes a board body 10 made of a plurality of stacked dielectric layers LY1 to LY4, a power terminal unit T1 with power terminals T1a and T1b formed on upper and lower surfaces 10-T and 10-B of the board body 10 and a ground terminal unit T2 with ground terminals T2a and T2b formed on the upper and lower surfaces 10-T and 10-B of the board body 10. The upper and lower power terminals T1a and T1b are connected to each other through a power via VH1 and the upper and lower ground terminals T2a and T2b are connected to each other through a ground via VH2.

At this time, an IC component 20 is mounted on the upper surface 10-T of the board body 10 and connected to the upper power terminal T1a and the upper ground terminal T2a through ground and power solder balls BG and BP.

In this multi-layer board, a first power line LP1 formed on the upper surface 10-T of the board body 10 includes a first connection line LP1a connecting a power terminal connected to, the power solder ball BP with the upper power terminal connected to the power via VH1 and a second connection line LP1b connecting the upper power terminal with a device-mounting power terminal PT.

In addition, a second power line LP2 formed inside the board body 10 is connected to the power terminal unit T1 through the power via VH1.

In addition, a first ground line LG1 formed on the upper surface 10-T of the board body 10 includes a first connection line LG1a connecting a ground terminal connected to the ground solder ball BG and the upper ground terminal connected to the ground via VH2, and a second connection line LG1b connecting the upper ground terminal and a device-mounting ground terminal GT. In addition, the second ground line LG2 formed inside the board body 10 is connected to the ground terminal unit T2 through the ground via VH2.

In this multi-layer board, at least one MLCC 11 is mounted on the upper surface 10-T of the board body 10, and the MLCC 11 is connected between the device-mounting power terminal PT and the device-mounting ground terminal GT, providing decoupling capacitance between the power line and the ground line.

An equivalent decoupling circuit of such a conventional multi-layer board is as shown in FIG. 2.

FIG. 2 is a circuit diagram illustrating equivalent decoupling capacitance between the power line and the ground line. Referring to FIGS. 1 and 2, the equivalent decoupling capacitance circuit between the power line and the ground line is an equivalent circuit of the MLCC and a line connected to the MLCC, in which the ground line can be expressed by inductance L1, capacitance C1 and resistance R1 connected in series.

Such a conventional multi-layer board uses the MLCC 11 to provide decoupling characteristics. However, using the MLCC 11 allows low impedance and effective decoupling characteristics in a low frequency band but does not allow sufficiently low impedance and rather mediocre decoupling characteristics in a radio frequency band.

Furthermore, the conventional multi-layer board has a long physical line connecting the MLCC with the power line and the ground, thus vulnerable to noise and hindering accurate decoupling capacitance.

SUMMARY OF THE INVENTION

The present invention has been made to solve the foregoing problems of the prior art and therefore an aspect of the present invention is to provide a multi-layer board having a decoupling function which uses a Multilayer Chip Capacitor (MLCC) and a thin film capacitor to provide excellent decoupling characteristics in a low frequency band as well as in a radio frequency band.

Another aspect of the invention is to provide a multi-layer board having a decoupling function which can provide more accurate decoupling capacitance.

According to an aspect of the invention, the invention provides a multi-layer board having a decoupling function. The multi-layer board includes: a board body having a plurality of stacked dielectric layers, power and ground terminals formed on upper and lower surfaces thereof, the power terminals formed on the upper and lower surfaces thereof connected with each other through a power via and the ground terminals formed on upper and lower surfaces thereof connected with each other through a ground via, and an integrated circuit component mounted on the upper surface thereof and connected to the power terminals and the ground terminals; a power line unit formed on a predetermined one of the plurality of dielectric layers of the board body, the power line unit connected to the power terminals and the integrated chip component; a ground line unit formed on a predetermined one of the plurality of dielectric layers of the board body, the ground line unit connected to the ground terminals and the integrated circuit component; at least one multilayer chip capacitor mounted on the upper surface of the board body and connected between the power terminal and the ground terminal formed on the upper surface of the board body; and at least one thin film capacitor mounted inside the board body and connected between the power line unit and the ground line unit.

The power line unit includes: a first power line formed on the upper surface of the board body and connected to the power terminal formed on the upper surface of the board body; and a second power line formed inside the board body and connected to the power via connecting the power terminals formed on the upper and lower surfaces of the board body.

The thin film capacitor is connected between the first power line and the ground line unit.

The thin film capacitor is connected between the second power line and the ground line unit.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
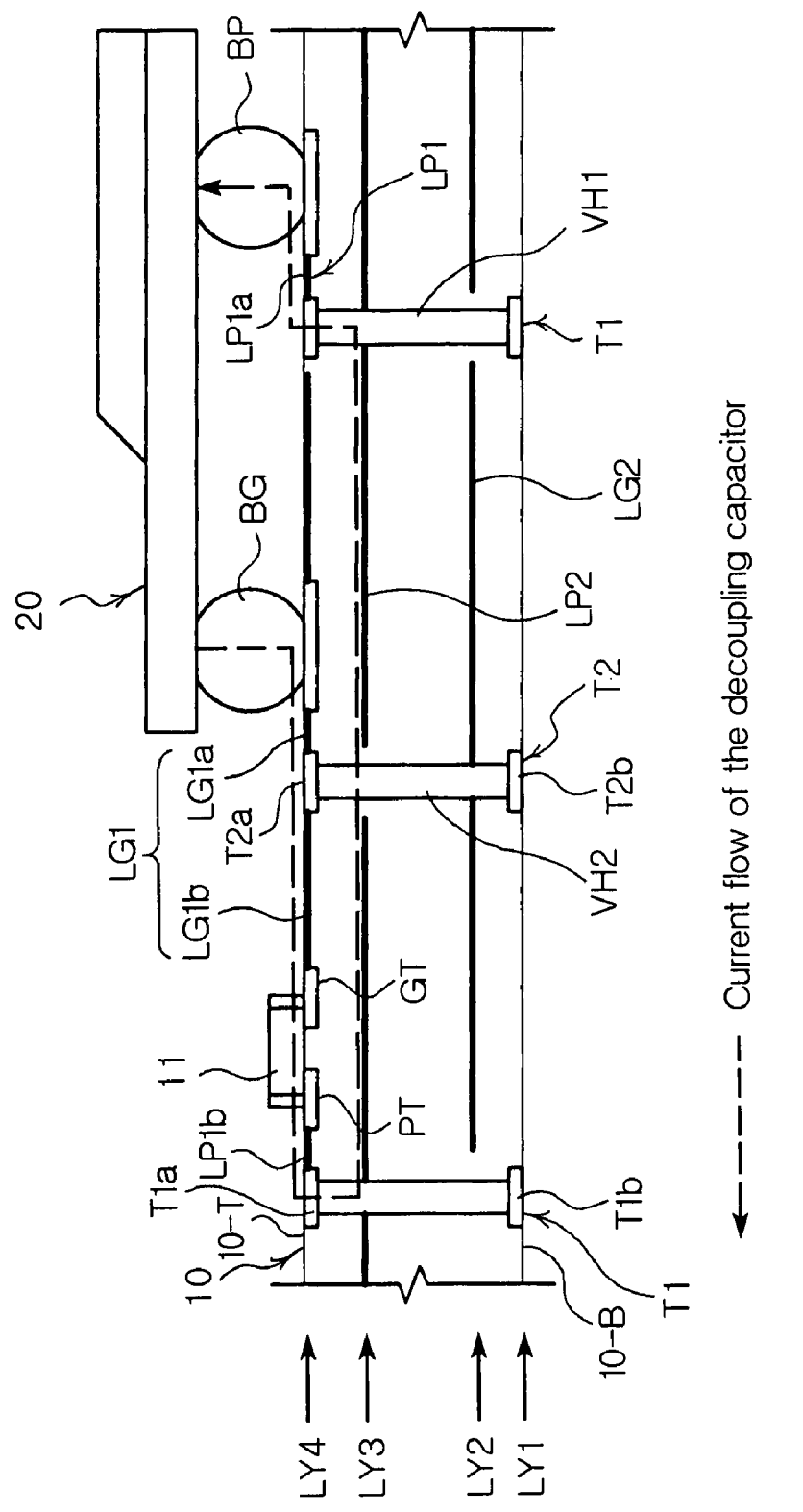
FIG. 1 is a structural diagram illustrating a conventional multi-layer board having a Multilayer Chip Capacitor (MLCC)
Figure 2:
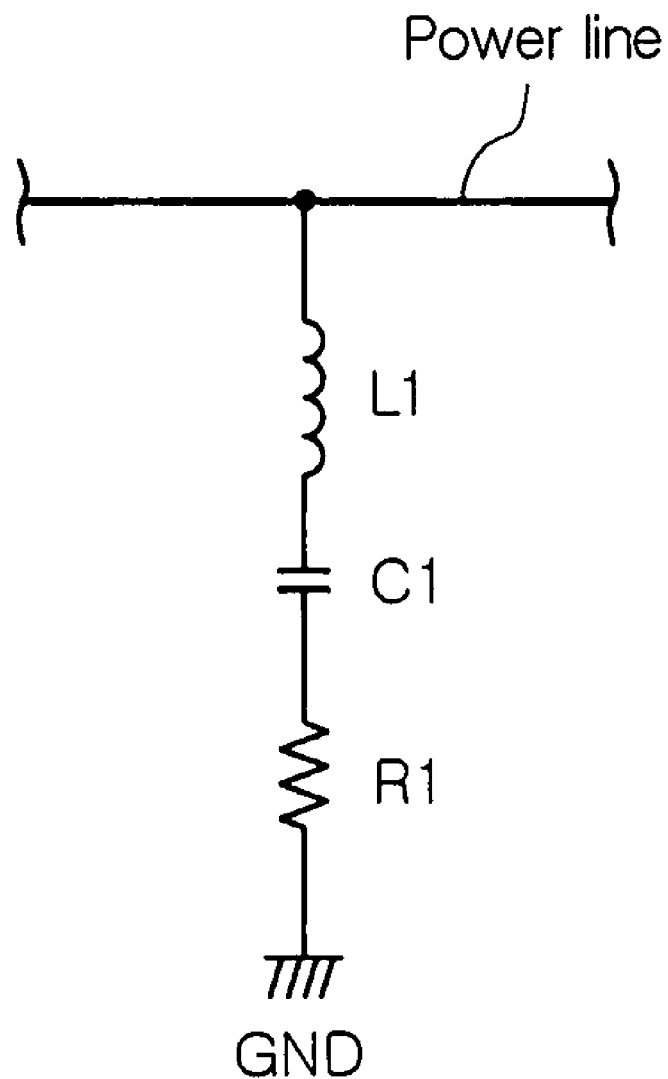
FIG. 2 is an equivalent circuit diagram illustrating decoupling capacitance between a power line and a ground line of FIG. 1.

Exemplary embodiments of the present invention will now be described in detail with reference to the accompanying drawings. In the drawings, the same reference numerals are used throughout to designate the components having substantially the same constructions and functions.

With current advancement and high function in a system or digital circuit, there have been increasing needs for a passive device or a device system capable of providing low impedance power in a radio frequency region (Giga Hz region). Therefore, the present invention is aimed to provide low impedance power, required by a digital circuit, in a radio frequency region, especially in a radio frequency region beyond a resonance point, where a Low Inductance Ceramic Capacitor (LICC) or Super Low Inductance Capacitor (SLIC), the Multilayer Ceramic Capacitors (MLCCs) conventionally used for decoupling, cannot ensure low impedance power. Further, the present invention uses embedded thin film capacitor and Multilayer Chip Capacitor (MLCC) produced at low temperature, thereby obtaining excellent characteristics in a radio frequency region in giga units, not achievable by the LICC or SLIC.

The present invention will now be explained in detail with reference to FIGS. 3 to 7.

Figure 3:
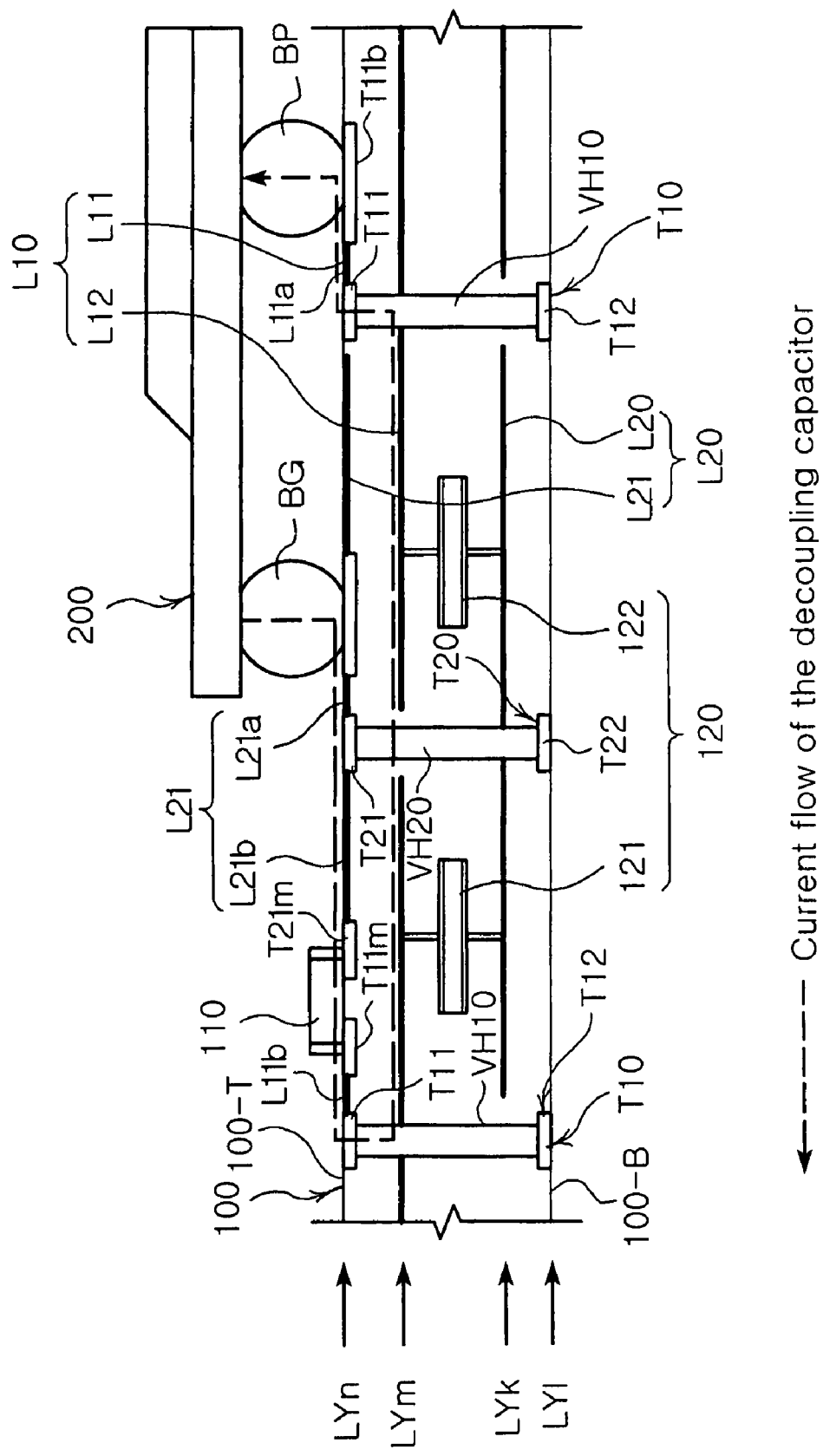
FIG. 3 is a structural diagram illustrating a multi-layer board having a decoupling function according to the present invention.

FIG. 3 is a structural diagram illustrating a multi-layer board having a decoupling function according to the present invention. With reference to FIG. 3, the multi-layer board according to the present invention includes a board body 100 having a plurality of stacked dielectric layers LY1, LYk, LYm and LYn, a power line unit L10, a ground line unit L20, at least one MLCC 110 and at least one thin film capacitor 120.

The board body 100 has a power terminal unit T10 including power terminals T11 and T12 formed on upper and lower surfaces 100-T and 100-B thereof and a ground terminal unit T20 including power terminals T21 and T22 formed on the upper and lower surfaces 100-T and 100-B thereof. The power terminals T11 and T12 respectively formed on the upper and lower surfaces 100-T and 100-B of the board body 100 are connected to each other through a power via. The ground terminals T21 and T22 formed on the upper and lower surfaces 100-T and 100-B of the board body 100 are connected to each other through a ground via. The board body 100 also has an Integrated Circuit (IC) component 200 mounted on the upper surface 100-T thereof and connected to the power terminal unit T11 and the ground terminal unit T21; through a power solder ball BP and a ground solder ball BG.

At this time, the upper power terminal T11 includes a ball-connecting power terminal T11b connected to the power solder ball BP and a device-mounting power terminal T11m.

In addition, the upper ground terminal T21 includes a ball-connecting ground terminal T21b connected to the ground solder ball BG and a device-mounting ground terminal T21m.

The power line unit L10 is formed on a predetermined power dielectric layer out of the plurality of dielectric layers of the board body 100 and connected to both the power terminal unit T10 and the IC component 200.

As shown in FIG. 3, according to an embodiment of the present invention, the power line unit L10 includes a first power line L11 formed on an upper surface 100-T of the board body 100, connecting the upper power terminal T11 and the ball-connecting power terminal T11b and connecting the upper power terminal T11 and the device-mounting power terminal T11*m*, and a second power line L12 formed in an interior 100-I of the board body 100 and connected to the power via V10 connecting the power terminals T11 and T12 formed on the upper and lower surfaces 100-T and 100-B of the board body 100.

At this time, the first power line L11 includes a first connection line L11*a* connecting the upper power terminal T11 with the ball-connecting power terminal T11*b*, and a second connection line L11*b* connecting the upper power terminal T11 with the device-mounting power terminal T11*m*.

The ground line unit L20 is formed on a predetermined ground dielectric layer out of the plurality of dielectric layers of the board body 100 and connected to both the ground terminal unit T20 and the IC component 200.

As shown in FIG. 3, according to an embodiment of the present invention, the ground line unit L20 includes a first ground line formed on an upper surface 100-T of the board body 100, connecting the upper ground terminal T21 with the ball-connecting ground terminal T21*b* and connecting the upper ground terminal T21 with the device-mounting ground terminal T21*m*, and a second ground line L22 formed in the interior 100-I of the board body 100 and connected to the ground via VH20 connecting the ground terminals T21 and T22 formed on the upper and lower surfaces 100-T and 100-B of the board body 100.

At this time, the first ground line L21 includes a first connection line L21*a* connecting the upper ground terminal T21 with the ball-connecting ground terminal T21*b*, and a second connection line L21*b* connecting the upper ground terminal T21 with the device-mounting ground terminal T21*m*.

Here, the power dielectric layer can be deposited on, the ground dielectric layers. On the other hand, if there are provided a plurality of power dielectric layers, the ground, dielectric layer may be deposited on some of the plurality of power dielectric layers.

The MLCC 110 is mounted on the upper surface 100-T of the board body 100 and connected between the device-mounting power terminal T11*m* connected to the upper power terminal T11 and the device-mounting ground terminal T21*m* connected to the upper ground terminal T21. As shown in FIG. 5, the MLCC 110 (FIG. 4) provides a portion of the total decoupling capacitance of the present invention.

The thin film capacitor 120 is embedded in the interior 100-I of the board body 100 and connected between the power line unit L10 and the ground line unit L20.

Specifically, in the case where the upper power terminal T11 includes the first power line L11 and the second power line L12 as described above, the thin film capacitor 120 can be connected between the second power line L12 and the ground line unit L20 as shown in FIG. 3.

Alternatively, the thin film capacitor 120 can be connected between the first power line L11 and the ground line unit L20.

As shown in FIG. 5, the thin film capacitor 120 according to the present invention provides a portion of the decoupling capacitance, which constitutes the total decoupling capacitance together with the capacitance provided by the MLCC 110.

The connection structure of the thin film capacitor 120 will now be explained with reference to FIG. 4.

Figure 4:
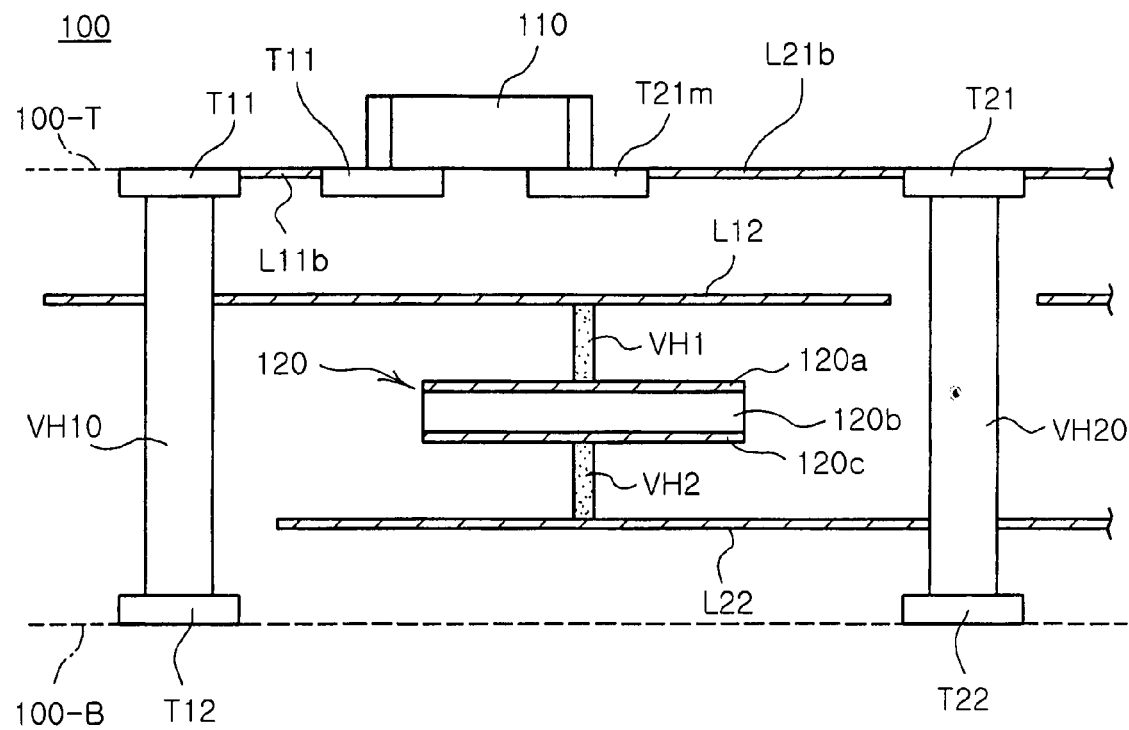
FIG. 4 is a partially enlarged structural diagram, illustrating the multi-layer board including a thin film capacitor shown in FIG. 3.
Figure 5:
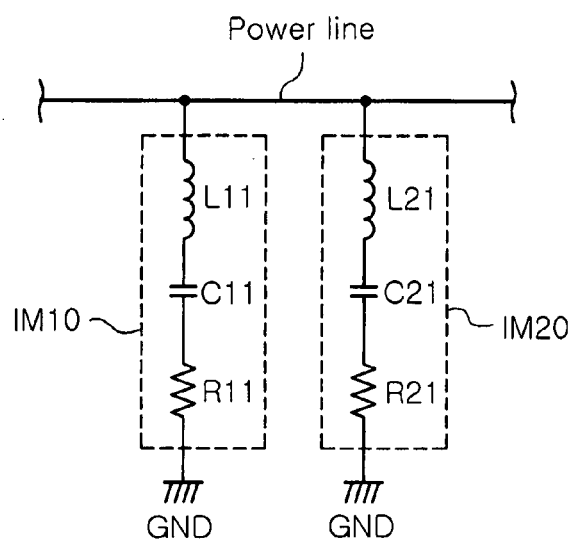
FIG. 5 is an equivalent circuit diagram illustrating decoupling capacitance between a power line and a ground line of FIG. 3.

FIG. 4 is a partially enlarged structural diagram illustrating the multi-layer board including the thin film capacitor shown in FIG. 3. With reference to FIGS. 3 and 4, the thin film capacitor 120 includes a dielectric layer 120*b* in the middle with upper and lower electrodes 120*a* and 120*c* formed on upper and lower parts thereof. The upper electrode 121 is connected to the second power line L12 and the lower electrode 122 is connected to the second ground line L22.

FIG. 5 is a circuit diagram of equivalent decoupling capacitance between the power line and the ground line of FIG. 3. Referring to FIG. 5, a first impedance circuit IM10 is an equivalent circuit for the MLCC 110, including inductance L11, capacitance C11 and resistance R11.

In addition, a second impedance circuit IM20 is an equivalent circuit for the thin film capacitor 120, including inductance L21, capacitance C21 and resistance R21.

In such an equivalent decoupling capacitance circuit, if the capacitance C11 by the MLCC 110 and the capacitance C21 of the thin film capacitor can be suitably combined to provide lower impedance in a low frequency region as well as in a radio frequency region, achieving superior decoupling characteristics.

The multi-layer board according to the present invention as set forth above is a multi-layer board of a Multilayer ceramic capacitor/Thin Film embedded Capacitor Hybrid system (MTFCH), which can provide various advantages in terms of structural, functional and economical aspects, compared with the conventional LICC type multi-layer board.

For example, based on the use in a particular product (e.g. Chipset Package: Intel i945G Chipset), the conventional LICC type multi-layer board requires 26 LICCs each with capacitance of 0.47 uF, resulting in the total capacitance of 12.2 uF. However, the multi-layer board of MTFCH according to the present invention requires 9 MLCCs (each with capacitance of 2 uF) and 9 thin film capacitors (each with capacitance of 70 nF) to configure a hybrid structure, resulting in superior capacitance of 18 uF with fewer capacitors.

According to the decoupling characteristics of the present invention, the frequency characteristics in a low frequency region is realized by the MLCC while the frequency characteristics in a radio frequency region is realized by the thin film capacitor, thereby obtaining the frequency characteristics separately in the low frequency and radio frequency regions.

Therefore, the present invention not only allows, superior performance but also incurs low manufacturing costs by utilizing the existing MLCC.

In addition, using the thin film capacitor embedded inside the board body allows a shorter physical electric length connecting the thin film capacitor with the power line and with the ground line, achieving more accurate decoupling capacitance.

Figure 6:
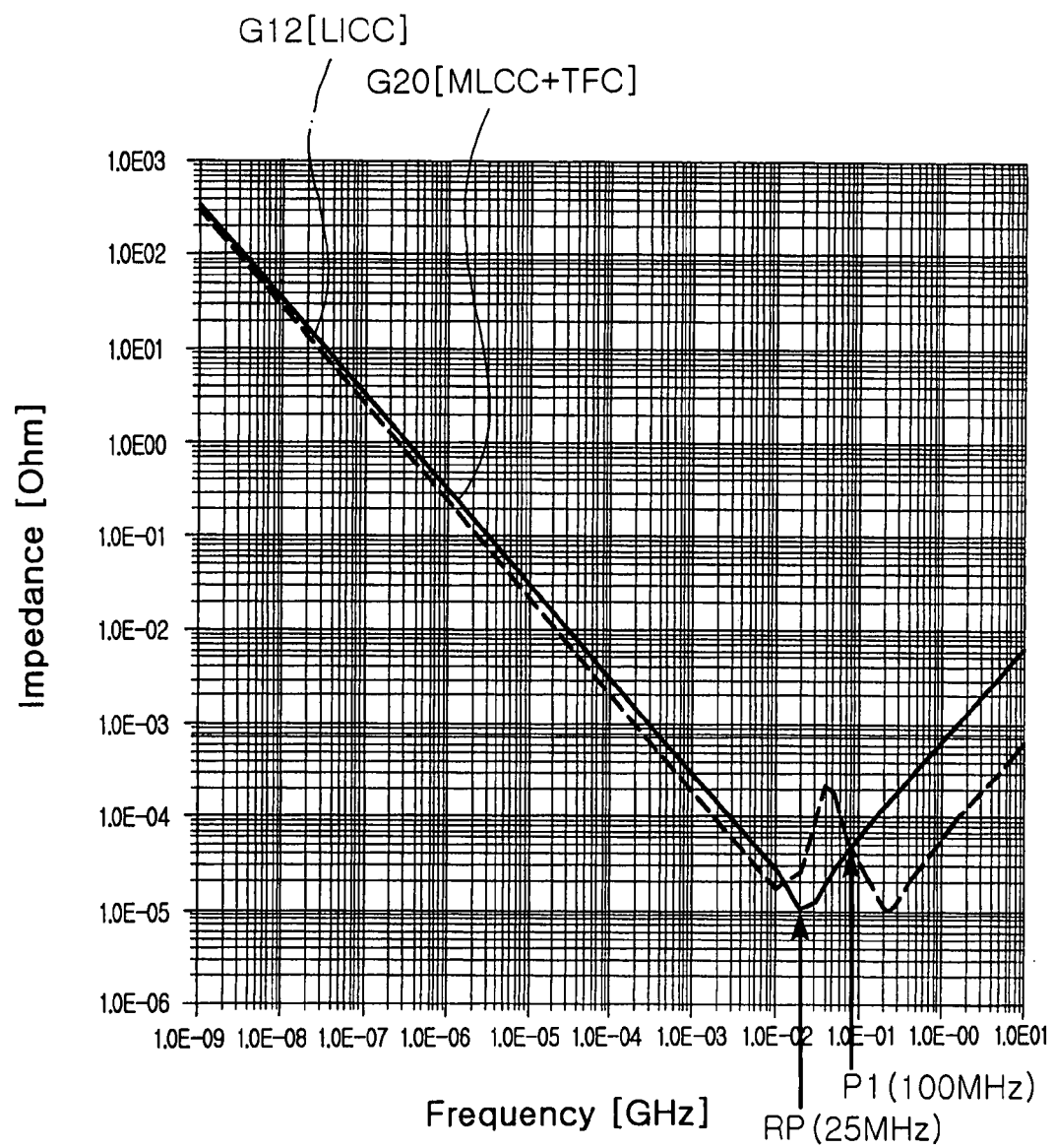
FIG. 6 is a graph comparing the frequency response characteristics between the multi-layer board according to the present invention and the conventional multi-layer board having a Low Inductance Ceramic Capacitor (LICC)

FIG. 6 is a graph illustrating the frequency response characteristics compared between the multi-layer board according to the present invention and the conventional multi-layer board having LICC. As shown in FIG. 6, G12 is an impedance characteristics plot of the conventional multi-layer board adopting an LICC type MLCC as a decoupling capacitor, whereas G20 is an impedance characteristics plot of the multi-layer board adopting MLCC and thin film capacitor as a decoupling capacitor.

Comparing G12 and G20 in FIG. 6, both exhibit characteristics similar to the prior art in a frequency region below the resonance point RP (resonance frequency at 25 MHz), but, exhibit low impedance characteristics improved from the prior art in a particular radio frequency region (25 MHz to 100 MHz) beyond the resonance point RP (resonance frequency at 25 MHz).

Figure 7:
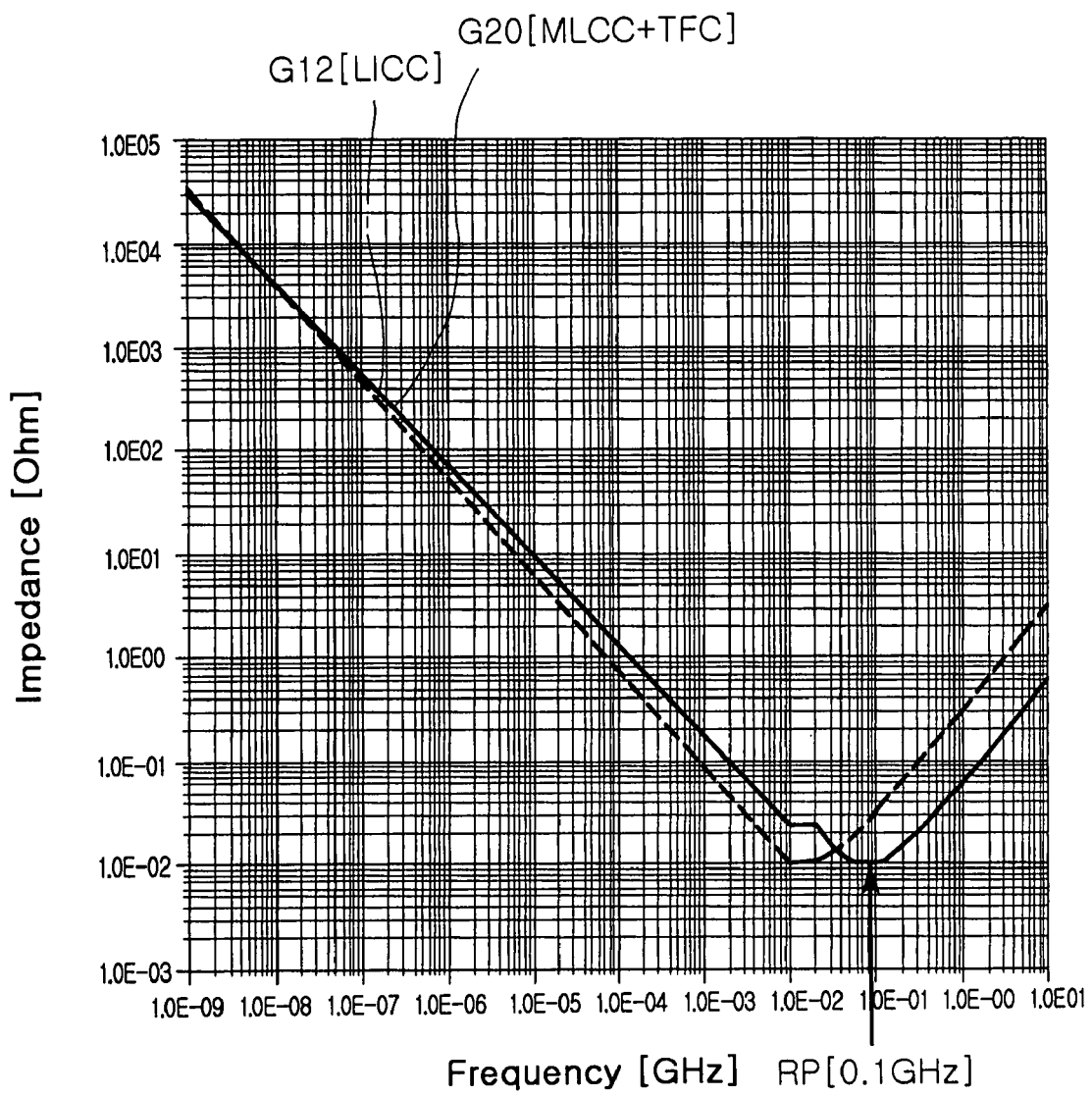
FIG. 7 is a graph comparing the frequency characteristics between the multi-layer board according to the present invention and the conventional multi-layer board having a Super Low Inductance Capacitor (SLIC).

FIG. 7 is a graph illustrating the frequency response characteristics compared between the multi-layer board according to the present invention and the conventional multi-layer board having SLIC. As shown in FIG. 7, G12 is an impedance characteristics plot of the conventional multi-layer board including an SLIC type MLCC as decoupling capacitor, whereas G20 is an impedance characteristics plot of the multi-layer board including MLCC and thin film capacitor as decoupling capacitor.

Comparing G12 and G20 in FIG. 7, both exhibit characteristics similar to the prior art in a low frequency region below the resonance point RP (resonance frequency at 0.1 GHz), but exhibit low impedance characteristics improved from the prior art beyond the resonance point RP (resonance frequency at 0.1 GHz).

According to the present invention as set forth above, a multi-layer board having a decoupling function, which is applicable to a Ball Grid Array (BGA) type package, utilizes MLCC and thin film capacitor to achieve superior decoupling characteristics in a low frequency band as well as in a radio frequency band.

In addition, according to the present invention, the multi-layer board provides more accurate decoupling, capacitance.

Furthermore, according to the present invention, the multi-layer board not only exhibits superior performance but also incurs low manufacturing costs by using the existing MLCC.

While the present invention has been shown and described in connection with the exemplary embodiments, it will be apparent to those skilled in the art that modifications and, variations can be made without departing from the spirit and scope of the invention as defined by the appended claims.

What is claimed is:

1. A multi-layer board having a decoupling function comprising:

a board body having a plurality of stacked dielectric layers, power and ground terminals formed on upper and lower surfaces thereof, the power terminals formed on the upper and lower surfaces thereof connected with each other through a power via and the ground terminals formed on upper and lower surfaces thereof connected with each other through a ground via, and an integrated circuit component mounted on the upper surface thereof and connected to the power terminals and the ground terminals;

a power line unit formed on a predetermined one of the plurality of dielectric layers of the board body, the power line unit connected to the power terminals and the integrated chip component;

a ground line unit formed on a predetermined one of the plurality of dielectric layers of the board body, the ground line unit connected to the ground terminals and the integrated circuit component;

at least one multilayer chip capacitor mounted on the upper surface of the board body and connected between the power terminal and the ground terminal formed on the upper surface of the board body; and at least one thin film capacitor mounted inside the board body and connected between the power line unit and the ground line unit.

2. The multi-layer board according to claim 1, wherein the power line unit comprises:

a first power line formed on the upper surface of the board body and connected to the power terminal formed on the upper surface of the board body; and a second power line formed inside the board body and connected to the power via connecting the power terminals formed on the upper and lower surfaces of the board body.

3. The multi-layer board according to claim 2, wherein, the thin film capacitor is connected between the first power line and the ground line unit.

4. The multi-layer board according to claim 2, wherein the thin film capacitor is connected between the second power line and the ground line unit.

* * * * *